(12) United States Patent
Hirst et al.

(10) Patent No.: US 10,530,294 B2
(45) Date of Patent: Jan. 7, 2020

(54) ULTRA-THIN, FLEXIBLE AND RADIATION-TOLERANT ECLIPSE PHOTOVOLTAICS

(71) Applicant: The Government of the United States of America as represented by the Secretary of Navy, Arlington, VA (US)

(72) Inventors: Louise C. Hirst, Hyattsville, MD (US); Michael K. Yakes, Alexandria, VA (US); Cory D. Cress, Alexandria, VA (US); Phillip Jenkins, Cleveland Heights, OH (US); Jeffrey H. Warner, Arbutus, MD (US); Kenneth Schmieder, Alexandria, VA (US); Robert J. Walters, Alexandria, VA (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 166 days.

(21) Appl. No.: 15/611,878

(22) Filed: Jun. 2, 2017

(65) Prior Publication Data

US 2017/0353149 A1 Dec. 7, 2017

Related U.S. Application Data

(60) Provisional application No. 62/345,019, filed on Jun. 3, 2016.

(51) Int. Cl.
*H02S 30/20* (2014.01)
*H01L 31/0392* (2006.01)
(Continued)

(52) U.S. Cl.
CPC ........ *H02S 30/20* (2014.12); *H01L 31/02366* (2013.01); *H01L 31/0304* (2013.01);
(Continued)

(58) Field of Classification Search
CPC . H02S 30/20; H01L 31/03926; H01L 31/055; H01L 31/0543; H01L 31/0547;
(Continued)

(56) References Cited

U.S. PATENT DOCUMENTS

2009/0026379 A1 1/2009 Yaigashi et al.
2009/0095341 A1* 4/2009 Pfenninger ........... H01L 31/048
136/246
(Continued)

FOREIGN PATENT DOCUMENTS

JP 2009212414 A 9/2009
WO WO2007098021 A2 8/2007

OTHER PUBLICATIONS

Yu et al., Novel long persisten luminescence phosphors: Yb2+ codoped MAL2O4 (M=Ba, Sr), Topical Materials Express, 5, All Pages. (Year: 2015).*
(Continued)

*Primary Examiner* — Daniel P Malley, Jr.
(74) *Attorney, Agent, or Firm* — US Naval Research Laboratory; Joslyn Barriti

(57) ABSTRACT

Photovoltaic (PV) device comprising an ultra-thin radiation-tolerant PV absorber mounted on a flexible film having an embedded persistent phosphor and having a plurality of interdigitated top and bottom contacts on the top of the PV absorber. The PV absorber is ultra-thin, e.g., typically having a thickness of 300 nm or less for a III-V-based absorber. The phosphor absorbs some of the photons incident on the
(Continued)

device and then discharges them for use by the device in generating electrical power during times when the device is not illuminated by the sun.

9 Claims, 3 Drawing Sheets

(51) Int. Cl.
*H01L 31/0236* (2006.01)
*H01L 31/054* (2014.01)
*H01L 31/0304* (2006.01)
*H01L 31/055* (2014.01)

(52) U.S. Cl.
CPC ...... *H01L 31/03926* (2013.01); *H01L 31/055* (2013.01); *H01L 31/0543* (2014.12); *H01L 31/0547* (2014.12); *Y02E 10/52* (2013.01)

(58) Field of Classification Search
CPC ........... H01L 31/02366; H01L 31/0304; Y02E 10/544; Y02E 10/52
See application file for complete search history.

(56) References Cited

U.S. PATENT DOCUMENTS

| | | | |
|---|---|---|---|
| 2011/0005575 A1* | 1/2011 | Cao ................. | H01L 31/02366 136/246 |
| 2011/0277813 A1* | 11/2011 | Rogers ............ | H01L 31/035281 136/244 |
| 2013/0087190 A1 | 4/2013 | Han et al. | |
| 2013/0092211 A1* | 4/2013 | Collin .............. | H01L 31/03529 136/246 |
| 2013/0114219 A1* | 5/2013 | Garner ............. | G02F 1/133308 361/750 |
| 2014/0069496 A1* | 3/2014 | Biswas ............. | B82Y 20/00 136/256 |
| 2015/0075612 A1* | 3/2015 | Lin .................. | H02S 40/22 136/257 |

OTHER PUBLICATIONS

Search Report and Written Opinion dated Sep. 8, 2017 in corresponding International Application PCT/US2017/035586.

Y. Li, M. Gecevicius, and J. Qiu, "Long persistent phosphors—from fundamentals to applications," Chemical Society Reviews 2016, 45 (8), 2090-2136.

A. Abdukayum, J.-T. Chen, Q. Zhao, and X.-P Yan, "Functional Near Infrared-Emitting Cr3+/Pr3+ Co-Doped Zinc Gallogermanate Persistent Luminescent Nanoparticles with Superlong Afterglow for in Vivo Targeted Bioimaging," Journal of the American Chemical Society 2013, 135 (38), 14125-14133.

Z. Pan, Y.-Y Lu, F. Liu, "Sunlight-activated long-persistent luminescence in the near-infrared from Cr3+-doped zinc gallogermanates," Nat. Matter. 2012, 11 (1), 58-63.

Fang Yu, Yanmin Yang, Xianyuan Su, Chao Mi, and Hyo Jin Seo, "Novel long persistent luminescence phosphors: Yb2+ codoped MAl2O4 (M=Ba, Sr)," Opt. Mater. Express 5, 585-595 (2015).

E. Yablonovitch, "Statistical ray optics," J. Opt. Soc. Am. 72, 899-907 (1982).

Owen D. Miller, Eli Yablonovitch, and Sarah R. Kurtz. "Strong internal and external luminescence as solar cells approach the Shockley-Queisser limit." IEEE Journal of Photovoltaics 2.3 (2012): 303-311.

X. Shi et al., "Efficient Luminescence of Long Persistent Phosphor Combined with Photonic Crystal," ACS Appl. Mater. Interfaces 2014, 6, 6317-6321.

Masafumi Yamaguchi, "Radiation resistance of compound semiconductor solar cells," Journal of applied physics 78.3 (1995): 1476-1480.

Masafumi Yamaguchi, "Radiation-resistant solar cells for space use," Solar energy materials and solar cells 68.1 (2001): 31-53.

Masafumi Yamaguchi et al., "Mechanism for radiation resistance of InP solar cells," Journal of applied physics 63.11 (1988): 5555-5562.

* cited by examiner

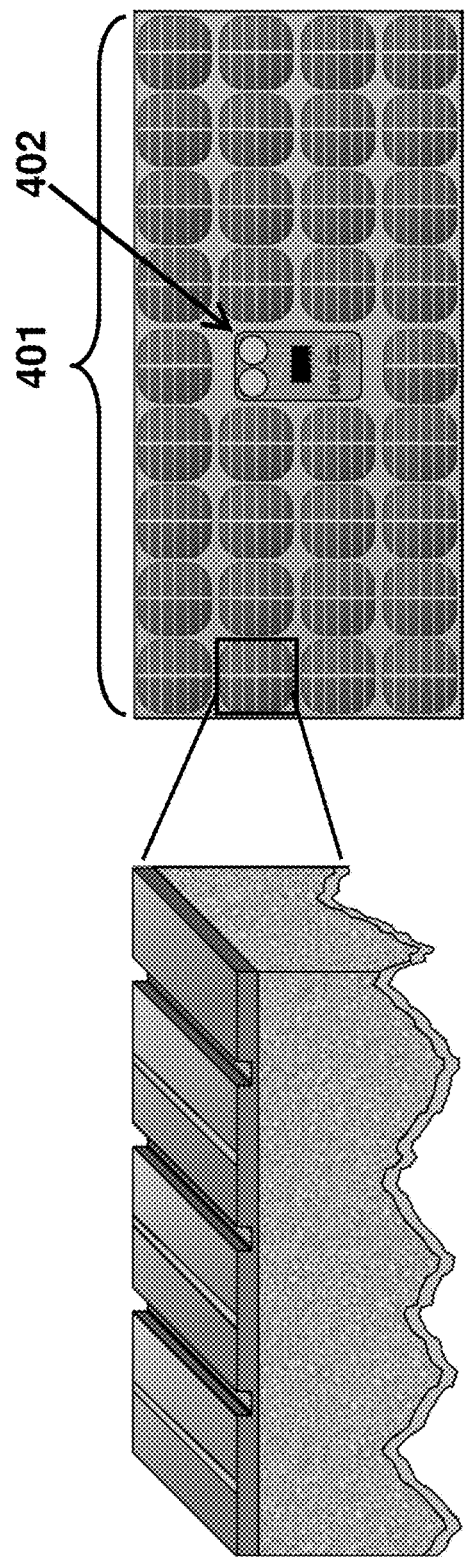
FIG. 4A
FIG. 4B
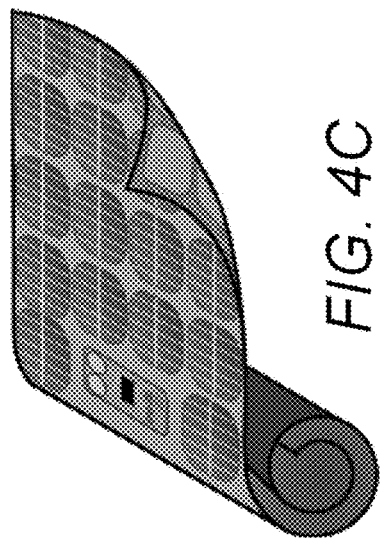
FIG. 4C

ULTRA-THIN, FLEXIBLE AND RADIATION-TOLERANT ECLIPSE PHOTOVOLTAICS

CROSS-REFERENCE

This Application is a Nonprovisional of and claims the benefit of priority under 35 U.S.C. § 119 based on U.S. Provisional Patent Application No. 62/345,019 filed on Jun. 3, 2016. The Provisional Application and all references cited herein are hereby incorporated by reference into the present disclosure in their entirety.

TECHNICAL FIELD

The present disclosure relates to photovoltaic devices, particularly to photovoltaic devices suitable for use in satellite-based payloads such as sensing and communications electronics.

BACKGROUND

Photovoltaic devices convert incident solar photons directly into useful electrical work. These devices allow for power generation in remote locations, making them particularly attractive for space power applications. Photovoltaic devices are the primary technology currently used to provide power to space-based payloads.

Space power solar cells have three key performance/design criteria:

(1) Specific power (W/kg): Space deployment costs are the primary expense involved in bringing new satellites online. These costs are governed by the satellite mass, a large fraction of which is the solar power system. Specific power describes power delivered per unit mass and hence determines the power available for satellite payloads.

(2) End of life performance: Radiation exposure in the harsh space environment rapidly degrades solar cell performance. Device designs which maintain solar energy conversion efficiency in these environments allow for reduced mission costs and new extended mission profiles.

(3) Satellite form factor: Conventional space solar cells in accordance with the prior art are implemented in rigid panels. Fully flexible solar panels would allow for new satellite form factors that can be particularly suitable for use in satellite applications. For example, rollable sheets of solar arrays can provide protection and efficient launch stowage of the array and can enable dynamic control of the array's deployment. Flexible solar panels can also enable the deployment of disaggregated micro-satellite swarms without the need for a vulnerable centralized power unit, or can be conformally wrapped around a satellite to provide power generation from every surface.

Current space power solar panels incorporate III-V multi-junction designs such as the third-generation triple junction (ZTJ) solar cell manufactured by SolAero, an exemplary embodiment of which is illustrated in the block schematic shown in FIG. 1. As illustrated in FIG. 1, a typical conventional ZTJ solar cell currently used in space power solar panels is grown on an active Ge substrate 101 with GaAs middle junction 102 and InGaP upper junction 103. This design provides a beginning-of-life (BOL) solar energy conversion efficiency of 29.5%.

However, this conventional cell design has several limitations.

First, conventional solar cells having this design produce relatively low specific power. Since specific power is power per unit mass (W/kg), the thick Ge substrate and radiation-protective cover glass substantially increase the mass of the solar cell, thus reducing the cell's specific power.

Second, conventional solar cells have poor radiation tolerance, which produces poor end-of-life performance because the cells degrade with total radiation dose. Multi-junction ZTJ cell devices are particularly sensitive to radiation exposure because the cells are connected in series and hence degradation in any of the subcells limits the performance of the whole stack. Such devices therefore require a protective coverglass over the cells to mitigate this degradation and extend device lifetime. The protection provided by thicker coverglass, however, must be traded against the increased mass and the resulting reduced specific power described above.

Finally, such cells must be implemented in thick, rigid panels, giving them a cumbersome form factor that can limit their use with new satellite designs.

One solution to the problems of ZTJ cells that has been proposed in the prior art uses the inverted metamorphic (IMM) device design illustrated by the block diagram in FIG. 2. Like the ZTJ design, the IMM device design also uses a Ge substrate with a GaAs middle junction and InGaP upper junction. However, in the IMM design, the device is grown in an inverted geometry, with the InGaP top junction 203 grown directly on the Ge substrate followed by the GaAs middle junction 202. A graded buffer layer 204 is then grown to move to a larger lattice constant to enable growth of a low defect InGaAs bottom cell. The structure is then inverted so that InGaAs layer 205 is at the bottom and Ge substrate 201 is at the top of the structure. Ge substrate 201 is then removed by a substrate removal process, leaving a triple junction device.

This structure addresses some of the limitations of the ZTJ design. Removing the heavy Ge substrate reduces the mass of the device, thus providing increased specific power and improving the structure's form factor flexibility. However, the radiation sensitivity of the multijunction cells used in the IMM design still necessitates the use of a coverglass, limiting the device's flexibility and its maximum potential specific power.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides an ultra-thin eclipse photovoltaic (PV) device that can provide power for satellite payloads such as sensing and communications electronics.

In an exemplary embodiment, an ultra-thin PV device in accordance with the present invention includes a radiation-tolerant PV element comprising an ultra-thin semiconductor-based PV absorber and a plurality of top and bottom electrical contacts, mounted on a flexible handle having a persistent phosphor embedded therein. In other embodiments, the phosphor-embedded handle can be inflexible, e.g., to provide stability of the array.

The thickness of the PV absorber is reduced to intentionally restrict solar absorption on the first pass and thus enable charging of the phosphor in the rear surface handle.

Some of the solar photons incident on the device will be transmitted through the ultra-thin PV absorber on the first pass. The phosphor embedded in the handle absorbs some of these photons, so that some of the incident solar energy is stored in the phosphor, while the optical structure of the handle is configured to scatter any remaining photons back into the PV absorber into angular modes that will be totally internally reflected at the front surface of the device. The phosphor discharges its stored absorbed energy over an extended time period through the re-emission of photons which will in turn be absorbed by the PV absorber to provide power during periods of eclipse, i.e., during times when the device is not illuminated by the sun.

In some embodiments, the ultra-thin PV absorber can be formed from III-V semiconductor materials such as gallium arsenide (GaAs) or indium phosphide (InP) having a thickness of about 300 nm or less. In other embodiments, the PV absorber can be formed from silicon (Si) having a thickness of about 2 µm or less.

The ultra-thin design of a PV device in accordance with the present invention provides high specific power and improved end of life solar energy conversion efficiency, and enables its implementation in a thin, flexible solar array particularly suitable for use in space applications.

BRIEF DESCRIPTION OF THE DRAWINGS

FIGS. 4A-4C are block schematics illustrating aspects of an ultra-thin, flexible, and radiation-tolerant eclipse photovoltaic device in accordance with the present invention.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides a new design architecture for ultra-thin, flexible photovoltaic (PV) devices which can exhibit ultra-high specific power achieved through weight reduction and has intrinsic radiation tolerance that removes the need for a coverglass. PV devices in accordance with the present invention can be incorporated into thin and flexible PV arrays that can be particularly suitable for use with lightweight and flexible satellite form factors and can provide power generation during periods of eclipse, i.e., during times when the device is not being illuminated by the sun.

In an "ultra-thin" PV device in accordance with the present invention, the thickness of the PV absorber is reduced to intentionally restrict absorption of photons from incident solar radiation on their first pass through the absorber and thus enable charging of the phosphor in the rear surface handle. An absorber in such an "ultra-thin" device can also be described as being "ultra-thin" since it forms only a part of a larger device, and if the larger device is ultra-thin, the absorber must necessarily also be ultra-thin.

As described in more detail below, an ultra-thin PV device in accordance with the present invention includes a PV element which provides radiation tolerance and high specific power, combined with a persistent phosphor embedded into a handle for eclipse power generation. In many embodiments, the handle will be flexible, so as to enable the implementation of the PV device into flexible forms such as rollable arrays of solar cells, while in other embodiments, the handle can be inflexible, e.g., to provide stability of the array.

Figures 1, 2:
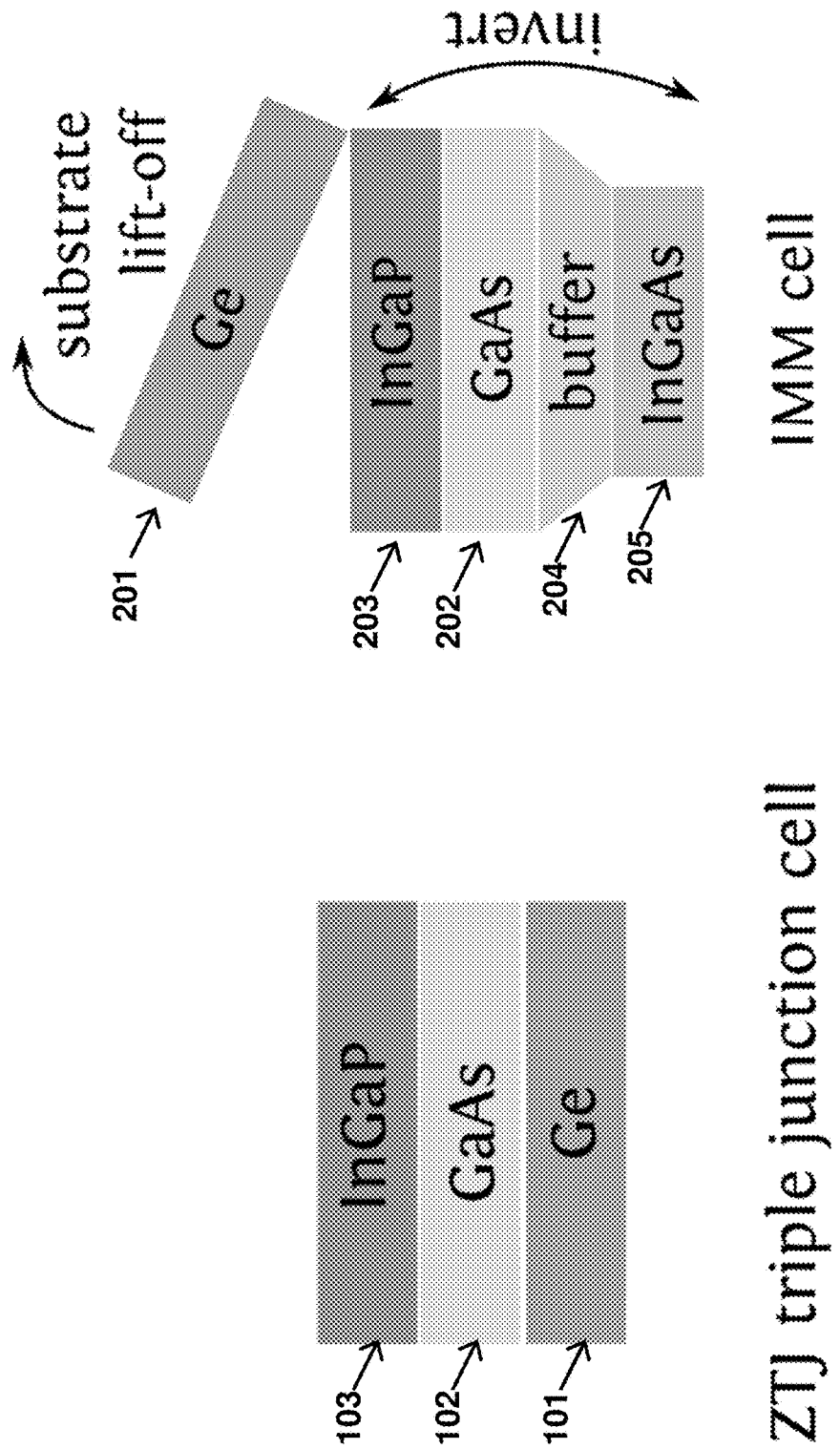
FIG. 1 is a block schematic illustrating an exemplary ZTJ triple junction photovoltaic cell in accordance with the prior art.
FIG. 2 is a block schematic illustrating an exemplary inverted metamorphic (IMM) photovoltaic cell in accordance with the prior art.
Figure 3:
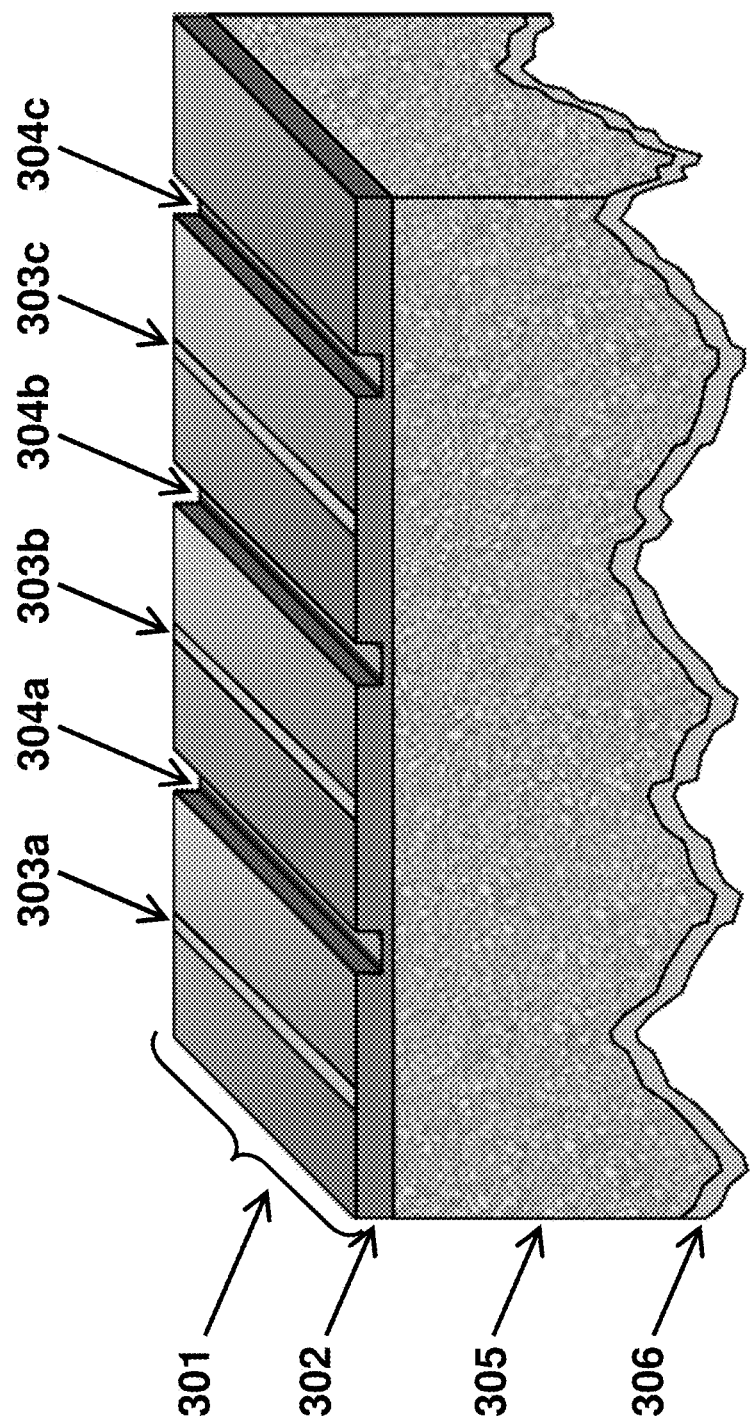
FIG. 3 is a block schematic illustrating aspects of an exemplary photovoltaic device structure in accordance with the present invention.

The block schematic shown in FIG. 3 illustrates aspects of an exemplary embodiment of an ultra-thin, flexible PV device in accordance with the present invention. Thus, as illustrated in FIG. 3, such an exemplary PV device in accordance with the present invention includes a PV element 301 comprising an ultra-thin PV absorber 302 with top and bottom electrical contacts 303a/b/c and 304a/b/c, respectively, mounted on a thin, flexible handle 305. In many embodiments, the flexible handle 305 can be formed from a polymer, but any other suitable material can be used, and can have any suitable thickness that still allows the desired degree of flexibility.

In addition, as described in more detail below, in accordance with the present invention, handle 305 has a persistent phosphor embedded therein, where the phosphor absorbs some of the photons incident on the PV device and subsequently discharges those photons back into the PV absorber for use in generating electrical power.

In some embodiments, PV absorber 302 can comprise a III-V-based absorber comprising a III-V material such as gallium arsenide (GaAs) or indium phosphide (InP) having a thickness of about 300 nm or less, while in other embodiments, PV absorber 302 can comprise a silicon-based absorber having a thickness of about 2 µm or less. In both such cases, the PV device incorporating such absorbers would be considered to be "ultra-thin" within the scope of the present invention. However, one skilled in the art will readily understand that other materials and/or other material layer thicknesses may be employed so long as the PV device remains "ultra-thin."

A PV device having such an ultra-thin PV absorber 302 in accordance with the present invention is intrinsically radiation-tolerant. When a PV absorber is exposed to radiation, defect sites are introduced into the absorber material, where the defect sites reduce the diffusion length of photogenerated charge carriers in the device. In traditional thicker cells, such as the ZTJ or IMM cells described above, charge carriers will recombine non-radiatively via these defect sites, thereby reducing device current. In contrast, in an ultra-thin PV device in accordance with the present invention, the thickness of the PV absorber is configured to prevent charge carriers photogenerated in the PV element from finding defect sites in the PV absorber and recombining there before they are transported to the top and bottom contacts, thereby preventing degradation of the photogenerated current.

As noted above, in a PV device in accordance with the present invention, PV absorber 302 is mounted on a flexible film having a persistent phosphor embedded therein. In recent years, several phosphors with persistent luminescence, in some cases lasting for hours after excitation, have been developed by various researchers. See, e.g., Y. Li, M. Gecevicius, J. Qiu, "Long persistent phosphors—from fundamentals to applications," *Chemical Society Reviews* 2016, 45 (8), 2090-2136; and A. Abdukayum, J.-T. Chen, Q. Zhao, X.-P Yan, "Functional Near Infrared-Emitting Cr3+/Pr3+ Co-Doped Zinc Gallogermanate Persistent Luminescent Nanoparticles with Superlong Afterglow for in Vivo Targeted Bioimaging," *Journal of the American Chemical Society* 2013, 135 (38), 14125-14133. $Cr^{3+}$ doped zinc gallogermanate appears a particularly promising candidate because of its desirable absorption and emission wavelength ranges for integration with GaAs of InP cells. See Z. Pan, Y.-Y Lu, F. Liu, "Sunlight-activated long-persistent luminescence in the near-infrared from Cr3+-doped zinc gallogermanates," *Nat. Matter.* 2012, 11 (1), 58-63. A 2 mm thick ceramic disk has been shown to emit >1 $mWm^{-2}$ one hour after photonic excitation has ceased. See Fang Yu, Yanmin Yang, Xianyuan Su, Chao Mi, and Hyo Jin Seo, "Novel long persistent luminescence phosphors: Yb2+ codoped MA12O4 (M=Ba, Sr)," *Opt. Mater. Express* 5, 585-595 (2015). It has also been shown that similar ceramic phosphors can be pulverized and embedded in a polymer for spin coating. Id.

Thus, in accordance with the present invention, PV element 301, comprising PV absorber 302 and top and bottom contacts 303a/b/c and 304/a/b/c, respectively, described in more detail below, is mounted on a flexible handle 305 having a persistent phosphor embedded therein. As described in more detail below, the optical design of the phosphor in handle 305 in accordance with the design of the present invention enhances the solar conversion efficiency of the ultra-thin PV device.

Some of the solar photons incident on the device will be transmitted through ultra-thin PV absorber 302 without being absorbed on the first pass. The phosphor embedded in handle 305 absorbs some of these photons, with the degree of photon absorption in the handle being dependent on the density of the embedded phosphor. Thus, some of the incident solar energy is stored in the phosphor, while the optical structure of the phosphor is configured to scatter any remaining photons back into the PV absorber into angular modes that will be totally internally reflected at the front surface of the device, providing additional photons for use by PV element 301 in generating electrical power.

In addition, the phosphor discharges its absorbed energy over an extended time period through the re-emission of photons into PV absorber 302 for use by PV element 301 in generating electrical power, thereby increasing the solar efficiency of PV element 301 during times when the device is being illuminated by the sun, and enabling PV element 301 to generate power even during periods of eclipse, i.e., at times when the device is not being illuminated by the sun.

Thus, the use of an ultra-thin PV absorber 302 in a PV device in accordance with the present invention uniquely enables the integration of a back-surface phosphor for energy storage and eclipse power. The phosphor is charged when the PV device is illuminated and discharges the stored energy optically during periods of eclipse, i.e., periods when the cell is not being illuminated. By integrating phosphors with the metrics described above, a PV device in accordance with the present invention can provide ~500 $\mu Wm^{-2}$ useful electrical power after 1 hour in the dark. This power level is more than sufficient to run essential non-stop processes such as the real-time clock and storing the motherboard BIOS settings during eclipse, without the need for a battery. This is desirable because traditional chemical batteries require a temperature regulated environment to function and also have a limited number of charging cycles. Additional low power functionality might also be enabled with large area coverage.

In addition, as noted above, the optical structure of the phosphor is configured to scatter any photons not absorbed by the phosphor back into the PV absorber. In the exemplary embodiment illustrated in FIG. 3, this is accomplished by randomly texturizing the rear surface of the handle to provide a Lambertian reflector 306 in the phosphor, followed by full metallization of the back surface thereof to provide an abrupt change in refractive index relative to the handle. In an exemplary embodiment, Lambertian reflector 306 can have an rms roughness on the order of 0.1-1 microns. However, one skilled in the art will recognize that other texturization parameters and/or other retroreflective mechanisms, such as light-scattering photonic structures, may be employed on the back surface of the phosphor handle to enhance the solar efficiency of the PV device.

As a result of the presence of Lambertian reflector 306, photons which are transmitted through PV absorber 302 on their first pass through the device are diffusely reflected at the rear surface into totally internally reflected optical modes. This photon reflection enables the achievement of high solar energy conversion efficiency in PV element 301, though the actual enhancement may depend on the quality factor of the reflector, along with the radiative efficiency of the device. The thermodynamic maximum absorption enhancement from Lambertian light trapping is given by $4n^2$, or approximately 50× enhancement in the case of III-V materials. See E. Yablonovitch, "Statistical ray optics," *J. Opt. Soc. Am.* 72, 899-907 (1982). Other authors have shown in theory that ultra-thin solar cells having a thickness of less than 100 nm can produce excellent performance metrics (solar energy conversion efficiency >30%) with such light scattering schemes. See Owen D. Miller, Eli Yablonovitch, and Sarah R. Kurtz. "Strong internal and external luminescence as solar cells approach the Shockley-Queisser limit." *IEEE Journal of Photovoltaics* 2.3 (2012): 303-311.

Finally, an additional design feature of a PV device in accordance with the present invention is the inclusion of a plurality of alternating, interdigitated top and bottom contacts. In traditional GaAs PV devices, the p-type contacts typically are unannealed, while the n-type contacts may require annealing to alloy the semiconductor with the metallization and create an Ohmic contact to extract photogenerated carriers. In such conventional devices, the rear surface has full metal coverage, even in the case where the rear surface is an annealed n-type contact. However, annealing a full coverage rear contact in an ultra-thin cell in accordance with the present invention would cause metal to diffuse into the active junction region of the device, severely degrading the diode performance.

The PV device design in accordance with the present invention solves this problem. To achieve an annealed rear contact without diffusing gold particles from the metal contacts into the junction, as illustrated in FIG. 3, a plurality of channels are etched from the front surface through to the highly doped back contact layer and metal is then deposited and annealed to form a plurality of bottom contacts 304a/b/c in the channels, which are interdigitated with top contacts 303a/b/c. This aspect of the PV device design of the present invention also eliminates the need for back surface device metallization located between the cell and scattering handle. In this way, efficient light coupling between PV element 301 and phosphor-embedded handle 305 can be engineered through handle index selection, without the constraints imposed by rear contact conductance requirements.

Traditional satellites are often designed with separate solar arrays connected to a large central payload. As illustrated in FIGS. 4A-4C, a plurality of PV devices in accordance with one or more aspects of the present invention can be incorporated into a thin, flexible PV array particularly suited to integration in a fully flat, fully flexible satellite design.

Thus, as illustrated in FIGS. 4A and 4B, a PV device in accordance with the present invention can be incorporated into an array 401 of such devices to provide large area panels that can enable their use with high-power payloads. Such payloads can be external to the array, or can be fully integrated into the array, as is payload 402 shown in FIG. 4B. In addition, as illustrated in FIG. 4C, such an array of ultra-thin PV devices in accordance with the present invention is ultra-lightweight and flexible, and the array, even one having an integrated payload 402, can be rolled up for storage before deployment, making it particularly suitable for applications where weight and space considerations are significant.

Advantages and New Features

The Table below summarizes the advantageous features of the present invention as compared to a typical prior art ZTJ cell with coverglass.

TABLE

| | ZTJ cell with coverglass | Ultra-thin cell with integrated phosphor handle |
|---|---|---|
| Specific power | 270 W/kg | 3030 W/kg, enables larger area panels and higher power payloads |
| Form factor | Rigid | Flexible |
| Eclipse power | No | Yes, ~500 $\mu Wm^{-2}$ useful electrical power after 1 hour in the dark |

A key innovation of a photovoltaic device in accordance with the present invention is the ultra-thin cell design, with the PV elements typically having a thickness of less than 100 nm, though cells having a thickness of about 200-300 nm can also be used. This ultra-thin cell design means that the diffusion length of photo-excited charge carriers is an order of magnitude longer than the device thickness, which makes the device intrinsically tolerant to defects induced by radiation exposure because charge carriers can be extracted at the device contacts, generating useful current, before they have time to diffuse into defect sites.

In addition, current state-of-the-art multi-junction PV elements for space applications, which typically have an active layer thickness of about 6 µm, are particularly sensitive to radiation induced defects and hence require thick rigid cover glass to maintain end of life performance. Removing the cover glass requirement with the ultra-thin design drastically increases panel specific power, allowing for larger panel area and high power payloads, and enables the development of new, flexible satellite form factors.

The PV device design of the present invention also addresses problems of light scattering that would otherwise reduce the efficiency of an ultra-thin PV device. In a cell having a thickness of less than 100 nm, only a small percentage, e.g., about 10%, of incident solar photons are absorbed on the first pass. To improve this absorption, the PV design of the present invention uses structures such as a Lambertian reflector or photonic scattering structures on the backside of the cell handle. As a result of this feature of the present invention, solar photons which are transmitted through the cell are diffusely scattered into optical modes beyond the solar acceptance angle, allowing for total internal reflection within the structure and enabling the achievement of full absorption of the incident photons in the ultra-thin design.

A second key innovation of the proposed device design is the use of an embedded persistent phosphor within the flexible backscattering handle. In the light, the phosphor absorbs some of the solar photons transmitted through the ultra-thin device and stores excitation energy in temporary trap states. Minutes after illumination begins the trap states saturate and Lambertian scattering on the back-surface enables efficient photon recycling between the phosphor and the cell for full one Sun device current and high efficiency device operation. When eclipse occurs, the temporary trap states of the phosphor discharge, generating power in the dark.

As noted above, the present invention eliminates the need for coverglass though the intrinsic radiation tolerance of the ultra-thin design, also enabling unprecedented specific power and truly flexible satellite form factors. The use of an ultra-thin cell also allows for eclipse power generation via a back-surface phosphor, which would not be possible in a traditional thick device.

Alternatives

InP cells: In most cases GaAs will be the most suitable material for the PV absorber because the GaAs/InGaP p-n junction has a very low surface recombination velocity, which is desirable for the ultra-thin design. However, InP is more radiation-tolerant than GaAs, and so may be more suitable in some applications.

Si-based cells: While PV devices based on III-V materials are usually used for space power applications because of the high efficiency which can be achieved, thin Si has cost advantages and so could be suitable for certain large area applications.

Photonic structure light scattering: As an alternative to a roughened Lambertian scattering rear surface a photonic structure might be employed to couple light into lateral propagation optical modes. Lambertian scattering was chosen for the best mode because it can be easily and inexpensively processed, however previous authors have shown that photonic structures can provide absorption enhancement well in excess of the thermodynamic limit for Lambertian scattering, making them a promising alternative for this invention.

The ultra-thin photovoltaic power system described enables new satellite form factors with reduced launch costs and high resiliency. The technology can enable extended mission profiles in hostile high radiation environments.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A photovoltaic (PV) device, comprising:
   a PV element comprising a PV absorber mounted on a handle embedded with a persistent phosphor and having a light-scattering rear surface; and a plurality of interdigitated top and bottom electrical contacts on a front surface of the PV element;

wherein photons incident on the PV device are converted into charge carriers by the PV element;

wherein a thickness of the PV absorber is configured to cause a first plurality of photons incident on the PV device to be absorbed by the PV absorber and a second plurality of photons incident on the PV device to be passed to the phosphor in the handle, the first plurality of photons being immediately converted to charge carriers by the PV element and the second plurality of photons being discharged back into the PV absorber for conversion to charge carriers over an extended period of time, the light-scattering rear surface of the handle being configured to cause the discharged photons to enter the PV absorber at angular modes that are totally internally reflected at a front surface of the PV absorber so as to provide additional photons for conversion into charge carriers by the PV element; and wherein a thickness of the PV element is configured so that a diffusion length of the charge carriers is greater than a thickness of the PV device so that the charge carriers can be extracted by the top and bottom electrical contacts before they diffuse into defect sites in the PV absorber.

2. The PV device according to claim 1, wherein the PV absorber comprises a III-V semiconductor material having a thickness of about 300 nm or less.

3. The PV device according to claim 1, wherein the PV absorber comprises GaAs.

4. The PV device according to claim 1, wherein the PV absorber comprises InP.

5. The PV device according to claim 1, wherein the PV absorber comprises silicon (Si) having a thickness of about 2 µm or less.

6. The PV device according to claim 1, wherein the light-scattering rear surface of the phosphor-embedded handle comprises a Lambertian reflector.

7. The PV device according to claim 1, wherein the light-scattering rear surface of the phosphor-embedded handle comprises a Lambertian reflector having an rms roughness of 0.1-1 µm.

8. The PV device according to claim 1, wherein the light-scattering rear surface of the phosphor-embedded handle comprises a light-scattering photonic structure.

9. The PV device according to claim 1, wherein the handle comprises a flexible film.

* * * * *